(12) United States Patent
Egawa

(10) Patent No.: US 8,879,297 B2
(45) Date of Patent: Nov. 4, 2014

(54) SEMICONDUCTOR DEVICE HAVING MULTI-LEVEL WIRING STRUCTURE

(71) Applicant: PS4 Luxco S.a.r.l., Luxembourg (LU)

(72) Inventor: Hidekazu Egawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/722,442

(22) Filed: Dec. 20, 2012

(65) Prior Publication Data

US 2013/0163303 A1   Jun. 27, 2013

(30) Foreign Application Priority Data

Dec. 21, 2011   (JP) ................. 2011-279846

(51) Int. Cl.
*G11C 7/10*        (2006.01)
*G11C 5/02*        (2006.01)
*G11C 11/4096*     (2006.01)
*G11C 11/4097*     (2006.01)
*G11C 5/06*        (2006.01)

(52) U.S. Cl.
CPC  *G11C 5/063* (2013.01); *G11C 5/02* (2013.01); *G11C 11/4096* (2013.01); *G11C 11/4097* (2013.01)
USPC ......................................................... 365/63

(58) Field of Classification Search
CPC .................................................. H01L 27/0207
USPC ......................................................... 365/63
See application file for complete search history.

(56) References Cited

U.S. PATENT DOCUMENTS

| 5,119,169 | A  | * | 6/1992 | Kozono et al. ................. 257/369 |
| 5,440,521 | A  |   | 8/1995 | Tsunozaki et al. |
| 6,175,516 | B1 |   | 1/2001 | Kitsukawa et al. |
| 6,339,541 | B1 | * | 1/2002 | Hardee et al. .................... 365/63 |
| 6,717,833 | B2 | * | 4/2004 | Kitsukawa et al. .............. 365/63 |
| 2001/0000687 | A1 |   | 5/2001 | Kitsukawa et al. |
| 2008/0013397 | A1 | * | 1/2008 | Park et al. ................. 365/230.06 |

FOREIGN PATENT DOCUMENTS

| JP | 06-068667 A  | 3/1994 |
| JP | 2000-049305 A | 2/2000 |

* cited by examiner

*Primary Examiner* — Huan Hoang
*Assistant Examiner* — Min Huang

(57) ABSTRACT

Disclosed herein is a device that includes a multi-level wiring structure including a first wiring layer and a second wiring layer formed over the first wiring layer; a memory cell array area including a plurality of memory cells, a plurality of sense amplifiers and a plurality of sub amplifiers; a main amplifier area including a plurality of main amplifiers, the memory cell array area and the main amplifier area being arranged in line in a first direction; and a plurality of first I/O lines each connecting an associated one of the sub amplifiers to an associated one of the main amplifiers, each of the first I/O lines including first and second wiring portions that are elongated in the first direction, the first wiring portion being formed as the first wiring layer and the second wiring portion being formed as the second wiring layer.

8 Claims, 8 Drawing Sheets

SEMICONDUCTOR DEVICE HAVING MULTI-LEVEL WIRING STRUCTURE

BACKGROUND OF THE INVENTION

1. Field of the Invention

The present invention relates to a semiconductor device, and more particularly relates to a semiconductor device having a configuration in which main I/O lines and power-supply lines are laid out on the same wiring layer.

2. Description of Related Art

As a type of semiconductor devices, an SDRAM (Synchronous Dynamic Random Access Memory) has been widely known. The SDRAM is a synchronous memory device that operates in synchronisms with a clock signal supplied from a controller device to input and output data. The SDRAM can increase its data transfer rate by using a faster clock signal.

In principle, a memory core of the SDRAM operates with an analog operation. A very weak charge that is read from a memory cell is amplified by a sense amplifier and then transferred to a peripheral circuit area via an I/O line system that is hierarchically structured. Therefore, in order to increase the data transfer rate, it is necessary not only to simply increase frequency of the clock signal, but to transfer data read from the memory cell to the peripheral circuit area with a faster speed.

Such a hierarchically structured I/O line system generally includes a local I/O line for transferring read data in a memory area and a main I/O line for transferring read data from a memory area to a peripheral circuit area. In this system, there is a case where the wiring length of the main I/O line is very long, for example, several millimeters. The local I/O line is connected to the main I/O line via a sub-amplifier, and data on the local I/O line is amplified by the sub-amplifier and transferred to the main I/O line.

The SDRAM also includes other types of wirings such as a column selection line and a power-supply line. The column selection line is connected to a column decoder provided in a column decoder area. The column selection line is laid out while passing above a memory cell array area, and controls a number of column switches. When a column select signal on the column selection line is activated, a corresponding bit line is connected to the local I/O line via a column switch in the sense amplifier.

The wirings described above are broadly classified into two types, that is, there are wirings extending in an X direction and those extending in a Y direction, and it is difficult to arrange both types of wirings on the same plane. Therefore, the SDRAM has a multi-level wiring stricture including a plurality of wiring layers to realize an efficient wiring layout. Specifically, on an upper layer of a memory cell array area where a cell transistor and a cell capacitor are formed, first to third wiring layers are provided in this order from bottom to top. The local or main I/O line, the column selection line, various types of power-supply lines, and the like are provided as these wiring layers. Because the higher the layer, the lower the wiring resistance, power-supply lines and a main I/O line having a long wiring length are preferably laid out as a higher wiring layer. For example, the column selection line is provided as the first wiring layer, the local I/O line is provided as the second wiring layer, and the main I/O line and various power-supply lines are provided as the third wiring layer.

Japanese Patent Application Laid-open No. 2000-49305 discloses a configuration of routing a vertical input/output line (a main I/O line) on a memory cell array by using a wiring of a third metal wiring layer. Japanese Patent Application Laid-open No. H6-68667 discloses a configuration in which a part of a wiring in a sense amplifier is laid out on the same wiring layer as a Y-selection line (a column selection line).

When a plurality of memory cells are highly integrated, the wiring density of a local I/O line and that of a main I/O line increase. For example, when the unit of allocation of local I/O lines is changed from 3 mats to 1.5 mats, the number of the local I/O lines doubles, and the number of main I/O lines required for connection with these local I/O lines also doubles. If these main I/O lines of an increased number are laid out by a conventional method, a wiring space in memory mats is occupied in a greater degree by a wiring area for the main I/O lines, and consequently a power-supply line area is reduced.

It is preferable that the resistance of power-supply lines is as low as possible. To this end, it is necessary to use a low-resistance wiring material and to design a wiring width wider. However, if the power-supply line area is reduced, the wiring width becomes narrow and the power-supply resistance in a memory cell array increases. This causes problems such as reduction in an operation margin.

SUMMARY

In one embodiment, there is provided a semiconductor device that includes: a memory mat including a plurality of memory cells; a sense amplifier located in a sense amplifier area and amplifying data supplied from the memory cells to generate first amplified data; a main amplifier that amplifies the first amplified data supplied from the sense amplifier; a main I/O line extends in a first direction to connect the sense amplifier to the main amplifier, the main I/O line including a first section provided over the memory mat as a first wiring layer and the second section provided over the sense amplifier area as a third wiring layer different from the first wiring layer; and a power-supply line provided as the third wiring layer such that the power-supply line overlaps with the first section of the main I/O line.

In another embodiment, there is provided a semiconductor device that includes: a memory mat having a plurality of bit lines each extending in a first direction, a plurality of word lines each extending in a second direction crossing to the first direction, and a plurality of memory cells arranged respectively at intersections of the bit lines and the word lines; a plurality of sense amplifiers coupled respectively to the bit lines, the sense amplifiers being provided in a sense amplifier area that is adjacent to the memory mat in the first direction; a plurality of column selection lines extending in the first direction and as a first wiring layer; a local I/O line extending in the second direction as a second wiring layer; a plurality of main I/O lines extending in the first direction, the main I/O lines being provided as a third wiring layer over the sense amplifier area and provided as the first wiring layer over the memory mat; and a power-supply line extending in the first direction and as the third wiring layer, a part of the power-supply line overlapping with the main I/O lines provided over the memory mat.

In still another embodiment, there is provided a semiconductor device that includes: a multi-level wiring structure including a first wiring layer and a second wiring layer formed over the first wiring layer; a memory cell array area including a plurality of memory cells, a plurality of sense amplifiers and a plurality of sub amplifiers; a main amplifier area including a plurality of main amplifiers, the memory cell array area and the main amplifier area being arranged in line in a first direction; and a plurality of first I/O lines each connecting an associated one of the sub amplifiers to an associated one of the main amplifiers, each of the first I/O lines including first and second wiring portions that are elongated in the first direction, the first wiring portion being formed as the first wiring layer and the second wiring portion being formed as the second wiring layer.

According to the present invention, because a third wiring layer is not widely occupied by a number of main I/O lines, a power-supply line area can be widely secured on the third wiring layer.

DETAILED DESCRIPTION OF THE PREFERRED EMBODIMENTS

The embodiment of the present invention will be now described herein with reference to illustrative embodiments. Those skilled in the art will recognize that many alternative embodiments can be accomplished using the teachings of the present invention and that the invention is not limited to the embodiments illustrated for explanatory. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

A configuration of a semiconductor device indicative of the embodiment will be explained with reference to FIG. 1. While the present embodiment is an example in which the present invention is applied to a DRAM, the application of the present invention is not limited to DRAMs.

Figure 1:
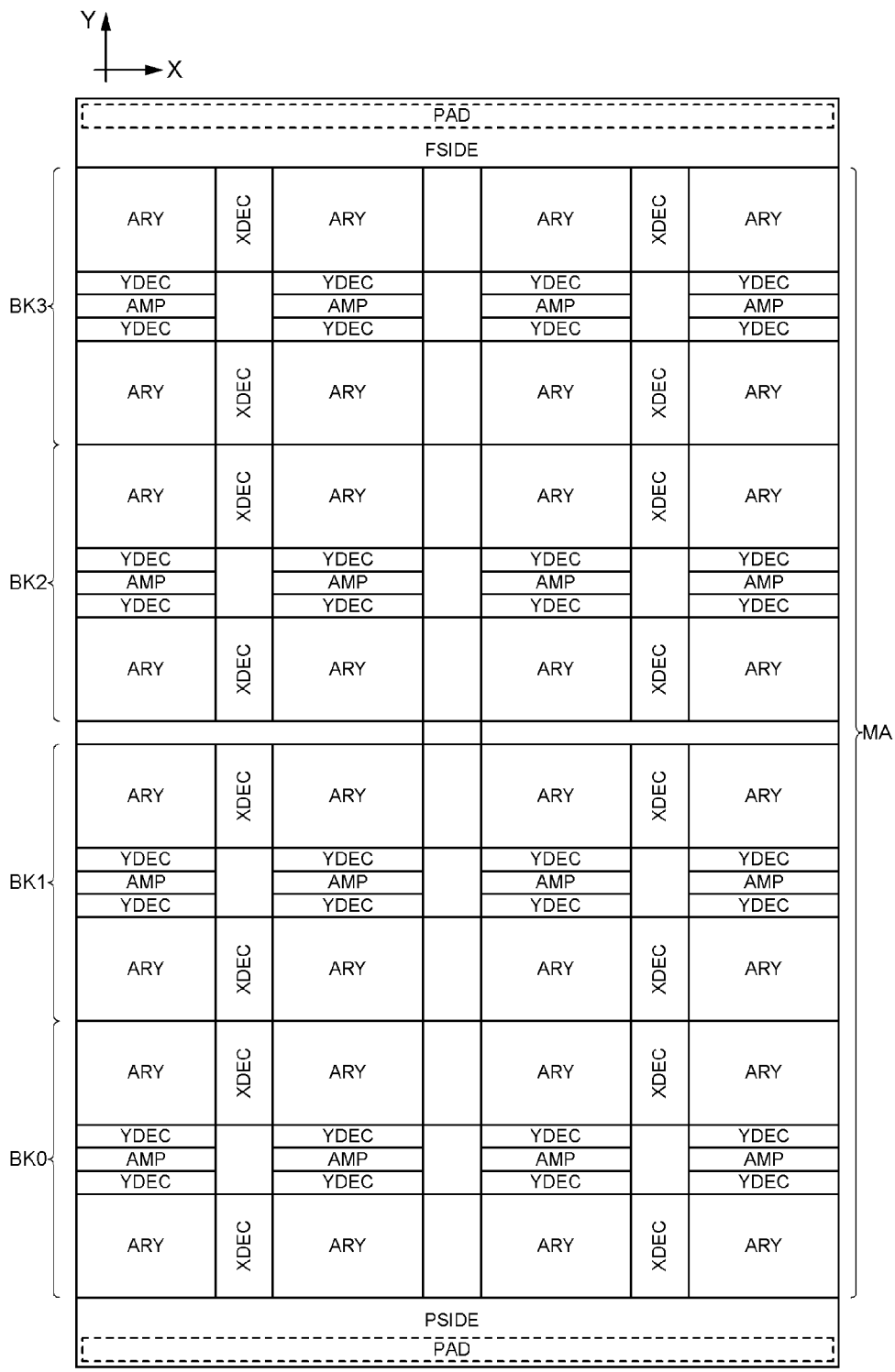
FIG. 1 is a schematic plan view showing a configuration of a semiconductor device according to an embodiment of the present invention.

The semiconductor device shown in FIG. 1 is constituted by a semiconductor chip including a memory area MA in which four memory banks BK0 to BK3 are formed and a peripheral circuit area positioned on both sides of the memory area MA in a Y direction.

The peripheral circuit area includes a first peripheral circuit area PSIDE including a pad area PAD that is arranged along an edge of the semiconductor chip, and a second peripheral circuit area FSIDE including another pad area PAD that is arranged along another edge of the semiconductor chip, which arranged on the opposite side to the first peripheral circuit area PSIDE. In many DRAMs, a pad area is provided in the center of a semiconductor chip; however, when a large number of data I/O pins (32 pins, for example) are provided, it becomes difficult to provide the pad area in the center of the semiconductor chip. In this case, as shown in FIG. 1, a plurality of pad areas is provided in peripheral parts of the semiconductor chip.

In the first peripheral circuit area PSIDE, elements such as an output buffer that outputs read data to a data I/O pin provided in the pad area PAD, and an input receiver that receives write data supplied via the data I/O pin are formed. In the second peripheral circuit area FSIDE, elements such as another input receiver that receives an address input via an address pin provided in the pad area PAD, and an address latch circuit that latches the address are formed.

The memory area MA is arranged between the first peripheral circuit area PSIDE and the second peripheral circuit area FSIDE. The memory banks BK0 to BK3 formed in the memory area MA are arranged in this order along a direction of connecting the first peripheral circuit area PSIDE and the second peripheral circuit area FSIDE (the Y direction).

Each of the memory banks BK0 to BK3 provided in the memory area MA includes memory cell array areas ARY, a row decoder area including row decoders XDEC provided adjacently to the memory cell array areas ARY in an X direction (a direction orthogonal to the Y direction), a column decoder area including column decoders YDEC provided adjacently to the memory cell array areas ARY in the Y direction, and a main amplifier area including a plurality of main amplifiers AMP provided adjacently to the column decoder area in the Y direction.

Figure 2:
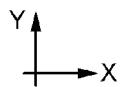
FIG. 2 is a schematic plan view showing a part of the memory cell array area ARY shown in FIG. 1 in an enlarged manner.

Turning to FIG. 2, the memory cell array area ARY includes a number of memory mats MAT that are arranged in matrix. The "memory mat" is an area in which sub-word lines and bit lines (both described later) extend. A sub-word driver area SW is provided between two memory mats MAT that are adjacent to each other in the X direction. Meanwhile, a sense amplifier area SAA is provided between two memory mats MAT that are adjacent to each other in the Y direction.

Furthermore, a sub-word cross area SX is provided in an area where an array of sub-word driver areas SW extending in the Y direction and an array of sense amplifier areas SAA extending in the X direction intersect with each other. In the sub-word cross area SX, elements such as a sub-amplifier that drives main I/O lines (described later) are arranged.

Figure 3:
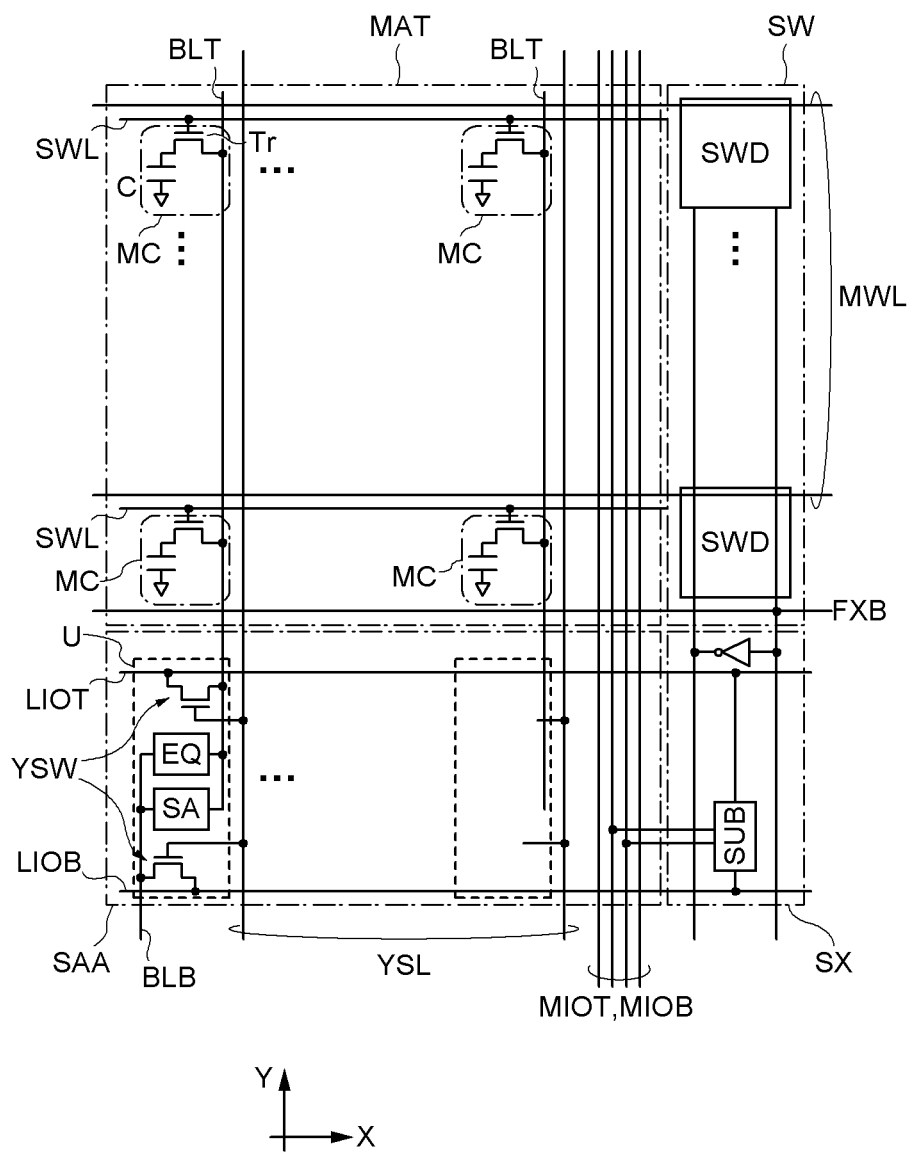
FIG. 3 is a schematic plan view showing a part of the memory cell array area ARY shown in FIG. 1 in a further enlarged manner.

As shown in FIG. 3, local I/O lines LIOT and LIOB extending in the X direction and main I/O lines MIOT and MIOB extending in the Y direction are provided in the memory cell array ARY. The local I/O lines LIOT and LIOB and the main I/O lines MIOT and MIOB are hierarchically structured I/O lines.

The local I/O lines LIOT and LIOB are used for transferring read data read out from a memory cell MC in a memory area. The local I/O lines LIOT and LIOB are differential I/O lines for transferring read data by using a pair of wirings. The local I/O lines LIOT and LIOB are laid out in the X direction on the sense amplifier area SAA and the sub-word cross area SX.

The main I/O lines MIOT and MIOB are used for transferring read data from the memory cell array area ARY to the main amplifier AMP. The main I/O lines MIOT and MIOB are also differential I/O lines for transferring read data by using a pair of wirings. The main I/O lines MIOT and MIOB are laid out in the Y direction on the memory cell array area ARY and the sense amplifier area SAA. A number of main I/O lines MIOT and MIOB extending in the Y direction are provided in parallel to each other and are connected to the main amplifier AMP provided in the main amplifier area.

In the memory mat MAT, memory cells MC are arranged at respective intersections of sub-word lines SWL and bit lines BLT or BLB. The memory cell MC has a configuration in which a cell transistor Tr and a cell capacitor C are connected in series between a corresponding one of the bit lines BLT or BLB and a plate wiring (such as a ground wiring). The cell transistor Tr is constituted by an N-channel MOS transistor, and a gate electrode thereof is connected to a corresponding one of the sub-word lines SWL.

A number of sub-word drivers SWD are provided in the sub-word driver area SW. Each of the sub-word drivers SWD drives a corresponding one of the sub-word lines SWL according to a row address.

Furthermore, a plurality of main word lines MWL and a plurality of word-driver selection lines FXB are connected to the sub-word drivers SWD. In particular in this embodiment, each of the main word lines MWL are coupled in common to corresponding four of the sub-word drivers SWD, and four word-driver selection lines FXB0-4 are coupled respectively to the four of the sub-word drivers SWD. By selecting any one of four sub-word drivers SWD selected by one main word line MWL by one of the four word-driver selection lines FXB, one sub-word line SWL is activated.

In the sense amplifier area SAA, a number of sense amplifiers SA, equalizer circuits EQ, and column switches YSW are arranged. Each of the sense amplifiers SA and the equalizer circuits EQ is connected to a corresponding one of pairs of the bit lines BLT and BLB. The sense amplifier SA amplifies a potential difference generated, as read data, in the corresponding one of pairs of the bit lines BLT and BLB, while the equalizer circuits EQ equalize potentials in the corresponding one of pairs of the bit lines BLT and BLB to the same level. Read data amplified by the sense amplifier SA is transferred to the local I/O lines LIOT and LIOB, and then further transferred to the main I/O lines MIOT and MIOB from these local I/O lines.

The column switches YSW are respectively provided between the bit lines BLT and BLB and the local I/O lines LIOT and LIOB, and connect the bit lines BLT and BLB and the local I/O lines LIOT and LIOB by causing corresponding column selection lines YSL to be activated at a high level. An end of the column selection line YSL is connected to the column decoder YDEC, and the column selection lines YSL are activated according to a column address. In the present embodiment, while the number is not particularly limited thereto, 88 column selection lines YSL are laid out on one memory mat MAT.

A plurality of sub-amplifiers SUB are provided in the sub-word cross area SX. For ease of explanation, one of the sub-amplifiers SUB in the sub-word cross area SX is shown in FIG. 3. The sub-amplifiers SUB are provided in plural numbers for each sub-word cross area SX and drives corresponding main I/O lines MIOT and MIOB. An input terminal of each of the sub-amplifiers SUB is connected to a corresponding pair of the local I/O lines LIOT and LIOB, and an output terminal of each of the sub-amplifiers SUB is connected to corresponding ones of the main I/O lines MIOT and MIOB. Each of the sub-amplifiers SUB respectively drives the main I/O lines MIOT and MIOB according to data on corresponding ones of the local I/O lines LIOT and LIOB.

As described above, the main I/O lines MIOT and MIOB are provided to pass over the memory mat MAT. Furthermore, an end of each of the main I/O lines MIOT and MIOB is connected to the main amplifier AMP provided in the main amplifier area. With this configuration, read data amplified by the sense amplifier SA is transferred to the sub-amplifier SUB via the local I/O lines LIOT and LIOB, and the data is then transferred to the main amplifier AMP via the main I/O lines MIOT and MIOB. The main amplifier AMP also amplifies data supplied via the main I/O lines MIOT and MIOB.

The semiconductor device having the above circuit configuration is manufactured by a well-known semiconductor process of forming a memory-cell transistor layer, a cell capacitor layer, a plurality of wiring layers, and the like in this order on a semiconductor substrate. In the present embodiment, as the plurality of wiring layers, a first wiring layer as which the column selection lines YSL extending in the Y direction are mainly arranged, a second wiring layer as which the main word lines MWL and the local I/O lines LIOT and LIOB extending in the X direction are mainly arranged, and a third wiring layer as which the main I/O lines MIOT and MIOB and various power-supply lines extending in the Y direction are mainly arranged are provided in this order from the semiconductor substrate side.

A relationship between the local I/O lines LIOT and LIOB and the main I/O lines MIOT and MIOB will be explained with reference to FIG. 4.

Figure 4:
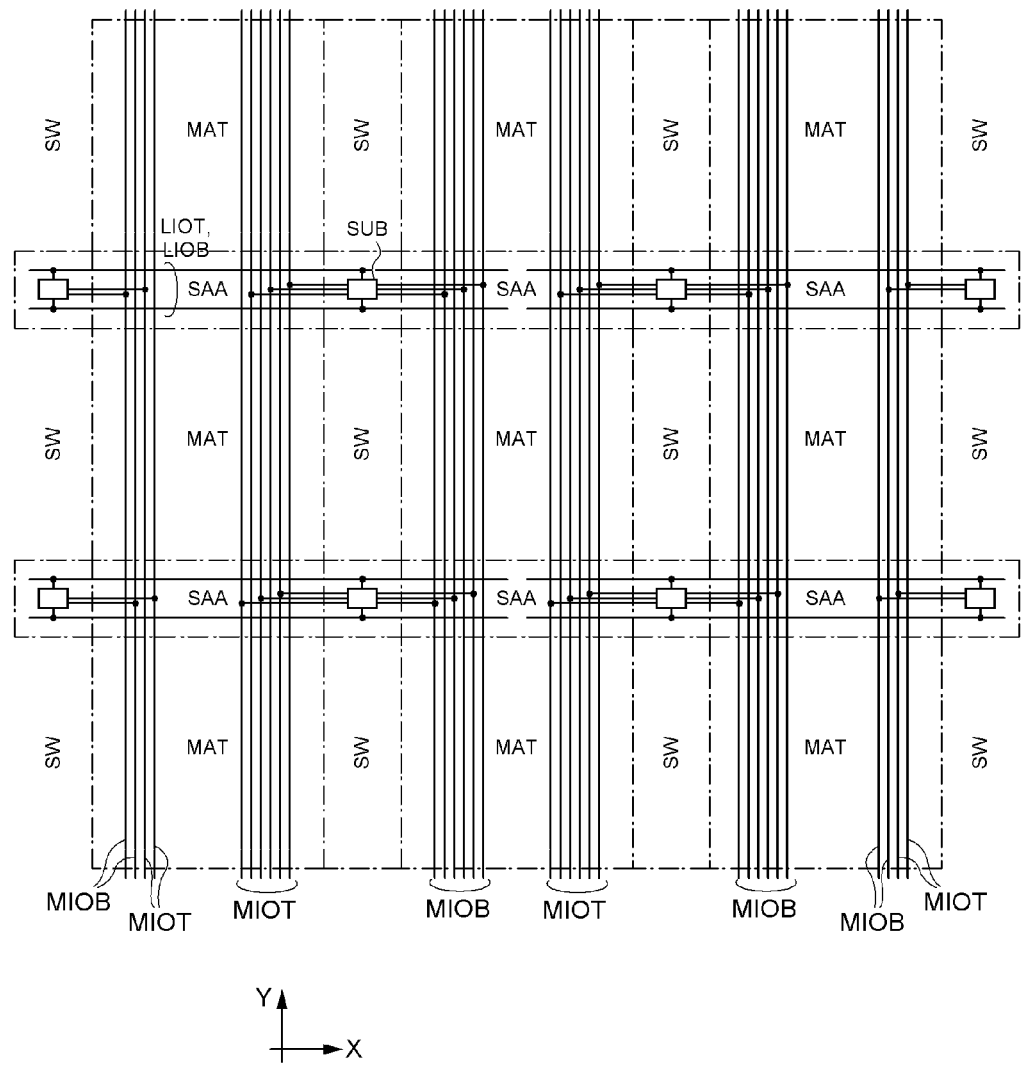
FIG. 4 is a plan view schematically showing an example of a relationship between the local I/O lines LIOT and LIOB and the main I/O lines MIOT and MIOB.

In the example shown in FIG. 4, four pairs of the local I/O lines LIOT and LIOB are provided in the sense amplifier area SAA. In FIG. 4, each one of the local I/O lines LIOT represents a four local I/O lines and each one of the local I/O lines LIOB represents a four local I/O lines. Therefore, a total of eight local I/O lines LIOT and LIOB, that is a four pairs of local I/O lines are provided in each of the sub-word cross areas SX. The local I/O lines LIOT and LIOB are provided as the second wiring layer. In this example, the length of each of the local I/O lines LIOT and LIOB in the X direction is approximately 1.5 times the length of the memory mat MAT. This means that the unit of allocation of each of the local I/O lines LIOT and LIOB is 1.5 mats. Among these four pairs of the local I/O lines LIOT and LIOB, three pairs are connected to corresponding main I/O lines MIOT and MIOB via three sub-amplifiers SUB arranged on one side in the X direction, and the remaining one pair is connected to corresponding main I/O lines MIOT and MIOB via one sub-amplifier SUB arranged on the other side in the X direction. Furthermore, in the present embodiment, because an open bit line system is applied, the sense amplifiers SA arranged in the sense amplifier areas SAA on both sides in the Y direction as viewed from each memory mat MAT are simultaneously selected. Therefore, data is read from one selected memory mat MAT via a total of eight pairs (that is, sixteen) of local I/O lines LIOT and LIOB and a total of eight pairs (that is, sixteen) of main I/O lines MIOT and MIOB. That is, it is necessary to allocate sixteen main I/O lines MIOT and MIOB for each 1.5 mats.

On the other hand, for example, when the local I/O lines LIOT and LIOB are provided with the unit of allocation of 3 mats, it suffices to arrange two sub-amplifiers SUB in each sub-word cross area SX. In this case, it suffices to allocate sixteen main I/O lines MIOT and MIOB for every three mats, and thus the wiring density of the main I/O lines MIOT and MIOB is decreased. In this manner, when the wiring length of the local I/O lines LIOT and LIOB is shortened, the wiring density of the main I/O lines MIOT and MIOB is increased. Therefore, in this case, there is a problem that a power-supply line area allocated to the same wiring layer of the main I/O lines MIOT and MIOB is squeezed. Accordingly, as explained below, in the present invention, this problem is solved by shifting a part of main I/O lines to a wiring layer that is different from a wiring layer as which a power-supply line area is formed.

Figure 5:
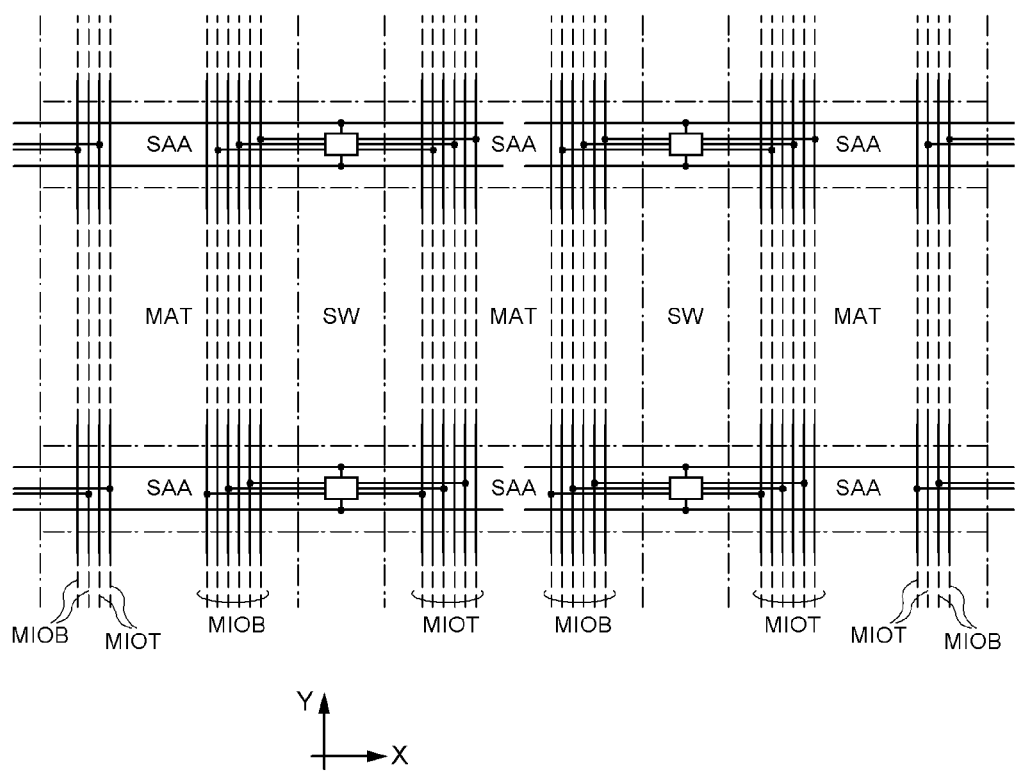
FIG. 5 is a plan view schematically showing a layout of the main I/O lines MIOT and MIOB on the third wiring layer.

As shown in FIG. 5, the main I/O lines MIOT and MIOB extend in the memory cell array area ARY in the Y direction and are provided as the third wiring layer at least above the sense amplifier area SAA. However, above the memory mat MAT, the most parts of each of the main I/O lines MIOT and MIOB are provided on the first wiring layer rather than the third wiring layer. In FIG. 5, the broken-line part of the main I/O lines MIOT and MIOB represents a part of these lines having been shifted to the first wiring layer. As for electrical connection between the main I/O lines MIOT and MIOB as the third wiring layer and those as the first wiring layer, a contact plug that penetrates an interlayer insulation film between these wiring layers is used. In this manner, by shifting the main I/O lines MIOT and MIOB above the memory mat MAT from the third wiring layer to the first wiring layer, empty spaces can be created in the third wiring layer above the memory mat MAT. Therefore, as described below in detail, these empty spaces can be used as spaces for power-supply lines.

Figure 6:
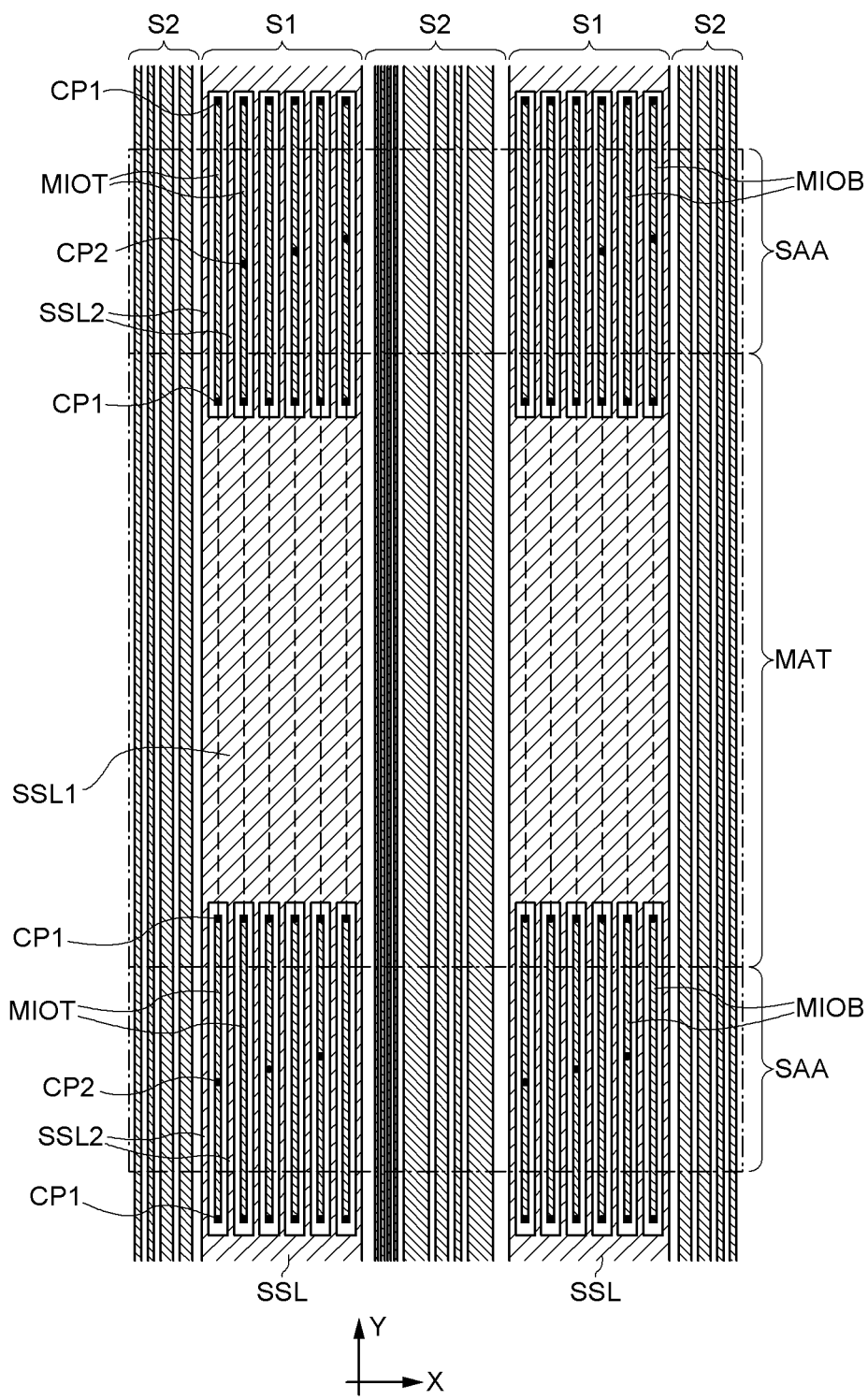
FIG. 6 is a plan view showing a specific layout of the third wiring layer.

As shown in FIG. 6, a total of twelve main I/O lines MIOT and MIOB as the third wiring layer are provided, that is, six of them are respectively provided on a predetermined memory mat MAT and a predetermined sense amplifier area SAA. Among these main I/O lines, six main I/O lines MIOT are connected to a sub-amplifier SUB arranged on one side in the X direction, and the rest of six main I/O lines MIOB are connected to a sub-amplifier SUB arranged on the other side in the X direction. In FIG. 6, areas in which these six main I/O lines MIOT and MIOB are respectively laid out are denoted as wiring areas S1. The space between the two wiring areas S1 is used as a general power-supply line area S2. As a power supply, an overdrive potential VOD, a boost potential VPP, an array potential VARY, a negative potential VBB, and a pre-charge potential VBLP, and the like can be mentioned.

While the main I/O lines MIOT and MIOB are provided as the third wiring layer in the sense amplifier area SAA, the main I/O lines MIOT and MIOB are provided as the first wiring layer in the memory mat MAT. The main I/O lines MIOT and MIOB provided as the first wiring layer and the main I/O lines MIOT and MIOB provided on the third wiring layer are connected via contact plugs CP1. Contact plugs CP2 are used for electrical connection between the main I/O lines MIOT and MIOB and the sub-amplifiers SUB. Connections between the main I/O lines MIOT and MIOB and the sub-amplifiers SUB are made by wirings provided as the second wiring layer in the X direction.

Empty spaces are created in the third wiring layer by shifting a part of the main I/O lines MIOT and MIOB provided in the wiring area S1 to the first wiring layer, where the part is positioned above the memory mat MAT. The empty spaces are used as areas for arranging power-supply lines SSL having an external power-supply potential VSS. The power-supply lines SSL of this part are very thick wirings formed widely on the entire empty space in the width direction (the X direction).

While it is preferable that the power-supply lines SSL having the external power-supply potential VSS are uniformly thick in the Y direction, in the sense amplifier area SAA, because the main I/O lines MIOT and MIOB are present as the third wiring layer, a plurality of thin wirings SSL2 are arranged in the sense amplifier area SAA such that the wirings SSL2 avoid contacting the main I/O lines MIOT and MIOB. In other words, the thin power-supply lines SSL2 and the main I/O lines MIOT and MIOB are alternately arranged at positions where the main I/O lines MIOT and MIOB are present. When the power-supply lines SSL having the external power-supply potential VSS are viewed from the Y direction, the power-supply lines SSL are formed such that the substantially thin wiring sections SSL2 at positions where the main I/O lines MIOT and MIOB are present and thick wiring sections SSL1 at positions where the main I/O lines MIOT and MIOB are not present are alternately arranged. Therefore, the thick wiring sections SSL1 are overlapped with main I/O lines formed on the first wiring layer in a planar view. By providing partially thick wiring sections SSL1 having wide in this manner, the resistance of power-supply lines can be reduced.

Figure 7:
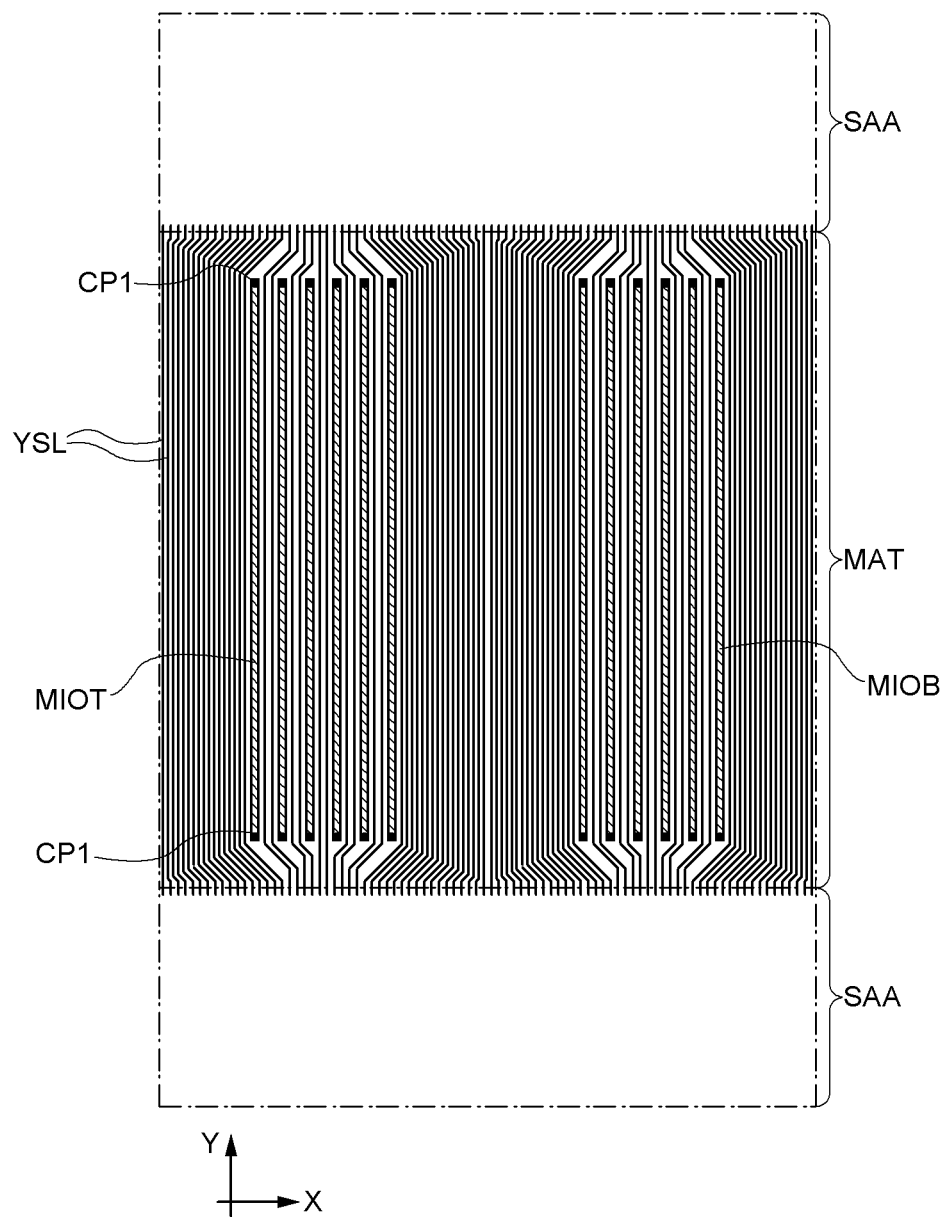
FIG. 7 is a schematic plan view showing an example of a specific layout of the first wiring layer in the memory mat MAT.

As shown in FIG. 7, a number of column selection lines YSL extending in the Y direction are mainly provided as the first wiring layer. In the present embodiment, the column selection lines YSL are moved over from a central part of the memory mat MAT in the width direction to either side thereof in the X direction, so that the column selection lines YSL avoid contacting the main I/O lines MIOT and MIOB. The main I/O lines MIOT and MIOB are arranged in empty spaces created in this manner around the central part of the memory mat MAT.

Column selection lines YSL in conventional techniques have a straight pattern extending from the sense amplifier area SAA in the Y direction with a predetermined pitch, and these lines straightly extend without being subjected to any pitch conversion. However, with this configuration, it is difficult to arrange the main I/O lines MIOT and MIOB at desired positions. Therefore, by narrowing the arrangement pitch of the column selection lines YSL, free spaces are created at desired positions where the main I/O lines MIOT and MIOB are intended to be formed.

It is preferred to arrange the main I/O lines MIOT and MIOB linearly in a planar configuration without changing the X direction thereof. Therefore, the X-coordinate of the main I/O lines MIOT and MIOB as the first wiring layer is preferably the same as that of the third wiring layer. Furthermore, it is preferred to arrange two column selection lines YSL between two main I/O lines that are adjacent to each other in the memory mat MAT. If the arrangement pitch of main I/O lines is wide, three or more column selection lines YSL can be arranged.

The column selection line YSL extending in the Y direction from the sense amplifier area SAA on one side bends immediately after entering in the memory mat MAT and then advances straight, and bends again immediately before reaching the sense amplifier area SAA on the other side to return to its original X-coordinate. In this manner, by using such a bending pattern, the column selection lines YSL are arranged to avoid contacting a layout area of the main I/O lines MIOT and MIOB.

As shown in the drawings, the main I/O lines MIOT and MIOB extending in the Y direction as the first wiring layer are line segments of being terminated in the memory mat MAT, and both ends of these main I/O lines are connected to the main I/O lines MIOT and MIOB as the third wiring layer via the contact plug CP1 provided in the memory mat MAT. With this configuration, the main I/O lines MIOT and MIOB extending in the Y direction are formed as one signal line that alternately accesses the third wiring layer in the sense amplifier area SAA and the first wiring layer in the memory mat MAT.

The first wiring layer in the sense amplifier area SAA, there are various wiring patterns required for constituting elements such as the sense amplifier SA, the equalizer circuit EQ, and the column switch YSW, and thus the sense amplifier area SAA is very congested (see a block U surrounded by the broken line in the sense amplifier area SAA shown in FIG. 3). Accordingly, the layout of these elements is almost up to the limit of its design standard, and thus, in the sense amplifier area SAA, there is no space left for routing the main I/O lines MIOT and MIOB. Meanwhile, only the column selection lines YSL are present in the memory mat MAT on the first wiring layer, and thus the layout of the memory mat MAT has a margin with respect to its design standard. Therefore, in the present invention, as in conventional techniques, the main I/O lines MIOT and MIOB are laid out as the third wiring layer in the sense amplifier area SAA, and the main I/O lines MIOT and MIOB are laid out as the first wiring layer only in the memory mat MAT. Subsequently, empty spaces in the third wiring layer created by shifting the main I/O lines MIOT and MIOB from the third wiring layer to the first wiring layer are allocated to power-supply line areas. With this configuration, the power-supply resistance in the sense amplifier area SAA can be reduced and stable voltage supply with respect to each block can be achieved.

In an LPDDR3 (Low-Power DDR3), as compared to an LPDDR2 (Low-Power DDR2), the number of prefetches doubles, and if a clock frequency of the LPDDR3 is the same as that of the LPDDR2, an operation frequency in an array in the LPDDR3 becomes half of that in the LPDDR2. Therefore, if load (a capacitance with respect to an adjacent column selection line) of the column selection line YSL is increased, it causes no problem and desired characteristics can be obtained. Furthermore, because the main I/O lines MIOT and MIOB access the third wiring layer and the first wiring layer, the resistance of these main I/O lines increases as much as the contact resistance thereof. However, because the operation frequency in an array becomes half as mentioned above, this feature is not a problem either.

Figure 8:
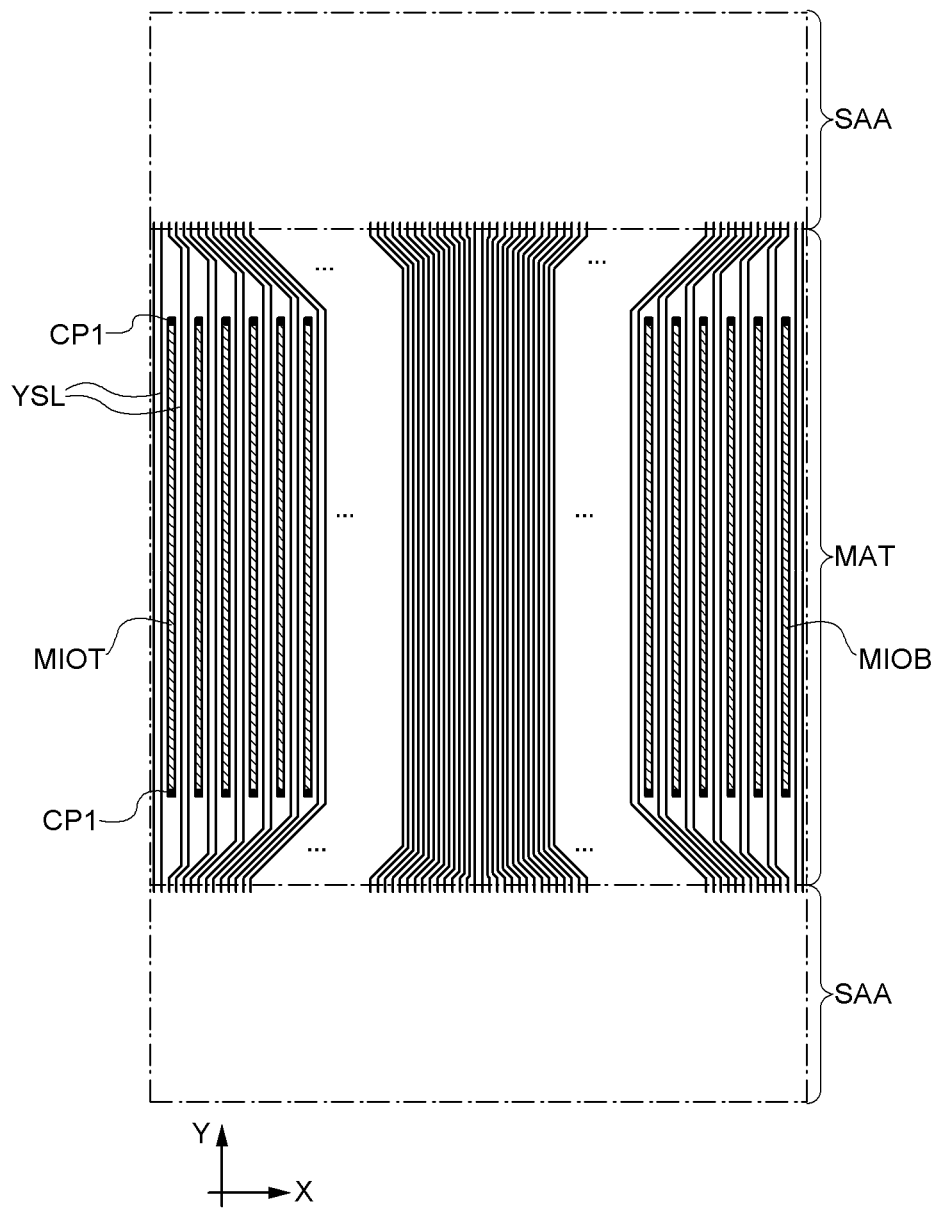
FIG. 8 is a schematic plan view showing another example of a layout of the first wiring layer.

In another example shown in FIG. 8, the main I/O lines MIOT and MIOB are arranged to be closer to both right and left sides of the memory mat MAT. In order to lay out these main I/O lines MIOT and MIOB as the first wiring layer, the column selection lines YSL are moved over from one side in the width direction of the memory mat MAT to a central part, and by this process, the empty spaces are created at a position closer to a side on the one side of the memory mat MAT.

As described above, it is preferred to arrange the main I/O lines MIOT and MIOB linearly in a planar configuration without changing the X-coordinate thereof, even when these main I/O lines are shifted from the third wiring layer to the first wiring layer. Therefore, when the main I/O lines MIOT and MIOB as the third wiring layer are arranged to be closer to both sides of the memory mat MAT, it is preferred to arrange these main I/O lines at planarly the same positions also as the first wiring layer. To this end, it is necessary to lay out the column selection lines YSL to move over to the center of the memory mat MAT. However, only very few column selection lines YSL are present on the left side of the main I/O line MIOT and on the right side of the main I/O line MIOB. Therefore, rather than those on the left and right sides, the column selection lines YSL positioned to be closer to the center of the memory mat MAT are laid out by moving them over to be even closer to the center, thereby securing empty spaces.

In the layout of FIG. 8, the length of the main I/O lines MIOT and MIOB as the first wiring layer becomes shorter than that in the layout of FIG. 7, and conversely, the length of the main I/O lines MIOT and MIOB arranged as the third wiring layer becomes longer than that in the layout of FIG. 7. Therefore, in view of the power-supply resistance, the layout of FIG. 7 is more advantageous. However, in the layout of FIG. 8, because the wiring length of a wiring for drawing the main I/O lines MIOT and MIOB into the sub-amplifier SUB can be shortened, load on the main I/O lines MIOT and MIOB can be reduced.

As explained above, in the semiconductor device according to the present invention, a part of the main I/O lines MIOT and MIOB, which are provided on the third wiring layer in their entirety in conventional techniques, is shifted from the third wiring layer to the first wiring layer, and the arrangement pitch of the column selection lines YSL provided on the first wiring layer in the memory mat MAT is narrowed, thereby securing empty spaces so as to lay out the part of the main I/O lines MIOT and MIOB in the empty spaces. Therefore, it is possible to avoid a problem that the third wiring layer is widely occupied by a number of main I/O lines MIOT and MIOB and thus a power-supply line area on the third wiring layer is narrowed.

It is apparent that the present invention is not limited to the above embodiments, but may be modified and changed without departing from the scope and spirit of the invention.

What is claimed is:

1. A semiconductor device comprising:
   a memory mat having a plurality of bit lines each extending in a first direction, a plurality of word each lines extending in a second direction crossing to the first direction, and a plurality of memory cells arranged respectively at intersections of the bit lines and the word lines;
   a plurality of sense amplifiers coupled respectively to the bit lines, the sense amplifiers being provided in a sense amplifier area that is adjacent to the memory mat in the first direction;
   a plurality of column selection lines extending in the first direction as a first wiring layer;
   a local I/O line extending in the second direction as a second wiring layer;
   a plurality of main I/O lines extending in the first direction, the main I/O lines being provided as a third wiring layer over the sense amplifier area and provided as the first wiring layer over the memory mat; and
   a power-supply line extending in the first direction as the third wiring layer, a part of the power-supply line overlapping with the main I/O lines provided over the memory mat.

2. The semiconductor device as claimed in claim 1, wherein an arrangement pitch of the column selection lines over the memory mat is narrower than an arrangement pitch thereof over the sense amplifier area to secure an empty space on the first wiring layer, the main I/O lines are arranged in the empty space in the first wiring layer over the memory mat.

3. The semiconductor device as claimed in claim 2, wherein the column selection lines have a roundabout pattern to form the empty space on a central part of the memory mat in the second direction.

4. The semiconductor device as claimed in claim 2, herein the column selection lines have a roundabout pattern to form the empty space on an end side of the memory mat in the second direction.

5. The semiconductor device as claimed in claim 1, further comprising a plurality of contact plugs each connected between an associated one of the main I/O lines provided as the first wiring layer and the associated one of the main I/O lines provided as the third wiring layer.

6. The semiconductor device as claimed in claim 1, wherein two column selection lines are arranged between adjacent two main I/O lines formed as the first wiring layer over the memory mat.

7. The semiconductor device as claimed in claim 1, wherein the power-supply line includes a first section that overlapping with the main I/O lines and a plurality of second sections elongated from the first section to the first direction, each of the second section is narrower in width than the first section, the main I/O lines and the second sections of the power-supply line are alternately arranged in the second direction on the first wiring layer, and the first and second sections of the power-supply line are short-circuited to constitute a single line that extends in the first direction.

8. The semiconductor device as claimed in claim 1, wherein the power-supply line is supplied with an external power-supply potential.

* * * * *

UNITED STATES PATENT AND TRADEMARK OFFICE
CERTIFICATE OF CORRECTION

PATENT NO. : 8,879,297 B2  
APPLICATION NO. : 13/722442  
DATED : November 4, 2014  
INVENTOR(S) : Hidekazu Egawa Page 1 of 1

It is certified that error appears in the above-identified patent and that said Letters Patent is hereby corrected as shown below:

In the Claims

Column 11, lines 1-2, should read "the power-supply line includes a first section that overlaps with the main I/O lines and a plurality of second".

Signed and Sealed this  
Seventeenth Day of February, 2015

Michelle K. Lee  
*Deputy Director of the United States Patent and Trademark Office*